(12) United States Patent
Feigenbaum et al.

(10) Patent No.: US 6,614,659 B2
(45) Date of Patent: Sep. 2, 2003

(54) DE-MOUNTABLE, SOLDERLESS IN-LINE LEAD MODULE PACKAGE WITH INTERFACE

(75) Inventors: Haim Feigenbaum, Irvine, CA (US); Blake F. Woith, Santa Ana, CA (US); John Szalay, Corona Del Mar, CA (US); Terry Wang, Irvine, CA (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 10/013,897

(22) Filed: Dec. 7, 2001

(65) Prior Publication Data

US 2003/0107874 A1 Jun. 12, 2003

(51) Int. Cl.[7] ................................................. H05K 7/20
(52) U.S. Cl. ........................... 361/719; 361/704; 439/66
(58) Field of Search ................................ 165/80.3, 185; 439/66, 91, 591, 485, 487; 361/704, 705, 717–719, 722, 734, 763, 785; 174/16.3, 252

(56) References Cited

U.S. PATENT DOCUMENTS

| | | | | |
|---|---|---|---|---|
| 3,789,347 A | * | 1/1974 | Cooper, Jr. | 439/425 |
| 3,885,173 A | * | 5/1975 | Lee | 310/313 B |
| 4,144,648 A | * | 3/1979 | Grovender | |
| 4,417,206 A | * | 11/1983 | Stowers | 324/756 |
| 4,692,790 A | * | 9/1987 | Oyamada | 257/727 |
| 4,869,068 A | * | 9/1989 | Van Vloten | 62/51.1 |
| 4,878,108 A | * | 10/1989 | Phelps, Jr. et al. | 257/796 |
| 5,287,001 A | * | 2/1994 | Buchmann et al. | 257/719 |
| 5,309,324 A | * | 5/1994 | Herandez et al. | 361/734 |
| 6,367,541 B2 | * | 4/2002 | McCullough | 165/80.3 |
| 6,392,887 B1 | * | 5/2002 | Day et al. | 361/704 |

* cited by examiner

Primary Examiner—Gerald Tolin
(74) Attorney, Agent, or Firm—Thomas N. Twomey

(57) ABSTRACT

Apparatus for holding and securing an electrical module, IC, or other electronic components to a PCB that is easy to use and manipulate. The apparatus utilizes a transitional element to hold the electrical module or IC and then secure itself to the PCB using fasteners or the like. Preferred methods for assembling and using the apparatus are disclosed.

34 Claims, 10 Drawing Sheets

DE-MOUNTABLE, SOLDERLESS IN-LINE LEAD MODULE PACKAGE WITH INTERFACE

This invention relates generally to the mounting of electrical modules to printed circuit boards, and specifically to a module package for securing an electrical module to a printed circuit board that is both solderless and de-mountable.

BACKGROUND OF THE INVENTION

Most if not all electronic devices (such as computers and televisions) utilize stuffed printed circuit boards (PCBs) to interconnect and transmit electrical signals between modules, parts or components (hereinafter "components"). These components typically vary from inexpensive resistors and capacitors to costly IC chips, microprocessors, laser transmitters, photo diode receivers, and transceivers, just to name a few. As is common in the prior art, a stuffed PCB is produced by soldering components (or their lead lines) onto the PCB (via PCB tracks or contact pads). Although "solder" is used to describe the joining of components onto the PCB, various other techniques for generating conductive, resistive, convective, and radiant heat for bonding are also common in the prior art, including infrared reflow soldering and wave soldering.

While engineered for extended service, on occasion some of the components will fail, either due to mis-use, manufacturing defect, or wear and tear. When this occurs, the problem is diagnosed, the malfunctioned component(s) isolated, and a new PCB is swapped for the failed one, if economically feasible to do so. However, from time to time, it may also be necessary to repair the failed PCB instead of replacing it, especially when price is an issue. If repair is an option, it is generally necessary to de-solder the leads of the failed IC chip (or other failed components) on the PCB and replace the failed chip with a new one.

Some common tools used for de-soldering are soldering guns or soldering irons which are capable of generating heat as high as 700° F. (370° C.), and are therefore very effective at melting solder to thereby free the failed IC chip. However, during repairs, the use of soldering guns can and do often cause other components or PCB to fail. Through conduction, when 700° F. heat is applied to remove the failed IC chip, the temperature also travels to nearby surfaces to effect other (good) components. This migration of heat has been known to cause failure to other components and possibly the entire PCB, which can cost from hundreds of dollars to several thousand dollars.

Thus, there remains a need for a solderless in-line lead module package and methods for using said package for safely securing and removing individual electronic components from a PCB without damaging nearby components or the PCB itself

SUMMARY OF THE INVENTION

The present invention provides a new and unique apparatus and method for securing an electrical module onto a PCB. A preferred embodiment includes a receptacle with anchoring surface in which fasteners or the like may be used instead of solder to encase and secure the electrical module onto the PCB.

In one embodiment, an in-line lead module package is provided for fixedly securing an electrical module to an electrical conducting medium, said package comprising a flex connector, a receptacle, and locking means, said receptacle is configured to secure the electrical module onto the flex connector by at least one of direct pressure and solder, and is further configured to secure the flex connector to the electrical conducting medium by at least one of direct pressure and solder, and wherein at least one direct pressure is generated by said locking means.

In another embodiment, an electrical module clamping apparatus for fixedly anchoring the module to the PCB is provided. Said apparatus comprising a receptacle, a flex circuit, and at least two alignment pins; said at least two alignment pins are configured to align the electrical module and its plurality of device leads to said flex circuit and its corresponding set of contacts or to align said flex circuit and its different set of contacts to said PCB and its corresponding contacts; and said receptacle is configured to removably secure said electrical module to said PCB by providing a locking surface to which screws or the like can cooperatively engage the entire assembly with the PCB.

In still yet another embodiment, solder is used to fixedly secure one of the rows of contacts on a flex circuit. However, in this configuration, provisions are provided so that the electrical module may be removed independent of said soldered flex circuit, or is removed with said flex circuit but independent of said PCB. In other words, in both instances, de-soldering is not required.

These as well as other objects and advantages of the present invention will be apparent from the following specification and the accompanying drawings, which are for the purpose of illustration only. Furthermore, it is understood that changes in the specific structure shown and described may be made within the scope of the claims without departing from the spirit of the invention.

DETAILED DESCRIPTION

The detailed description set forth below in connection with the appended drawings is intended as a description of the presently preferred embodiments of the in-line lead module package provided in accordance with the present invention and is not intended to represent the only forms in which the present invention may be constructed or utilized. The description sets forth the functions and the steps for constructing and operating the in-line lead module package of the present invention in connection with the illustrated embodiments. It is to be understood, however, that the same or equivalent functions and structures may be accomplished by different embodiments that are also intended to be encompassed within the spirit and scope of the invention. Also, as denoted elsewhere herein, like element numbers are intended to indicate like or similar elements or features.

Figure 1:
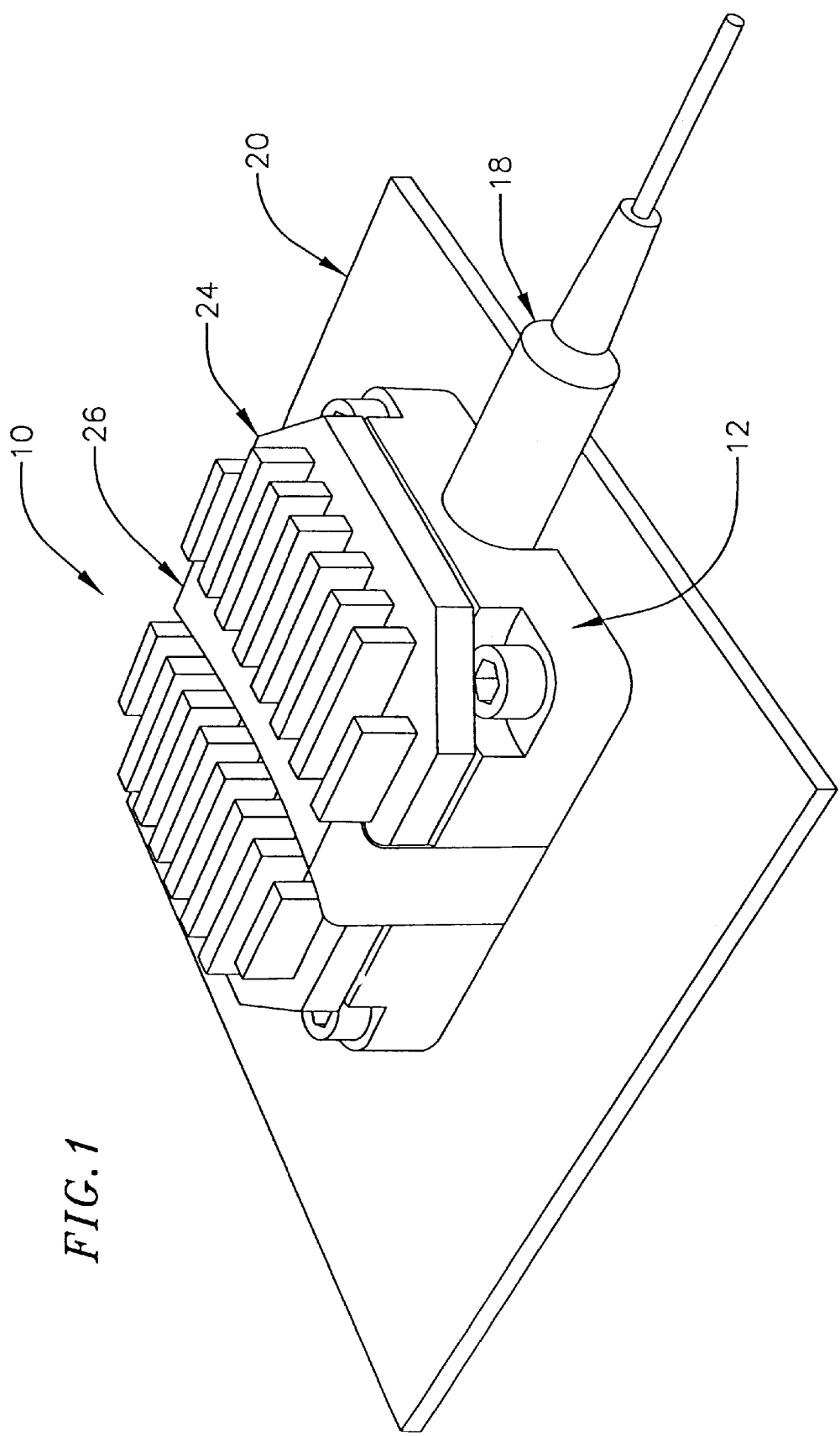
FIG. 1 is a semi-schematic isometric drawing of a preferred embodiment of an inline module package of the present invention in a clamped position.
Figure 2:
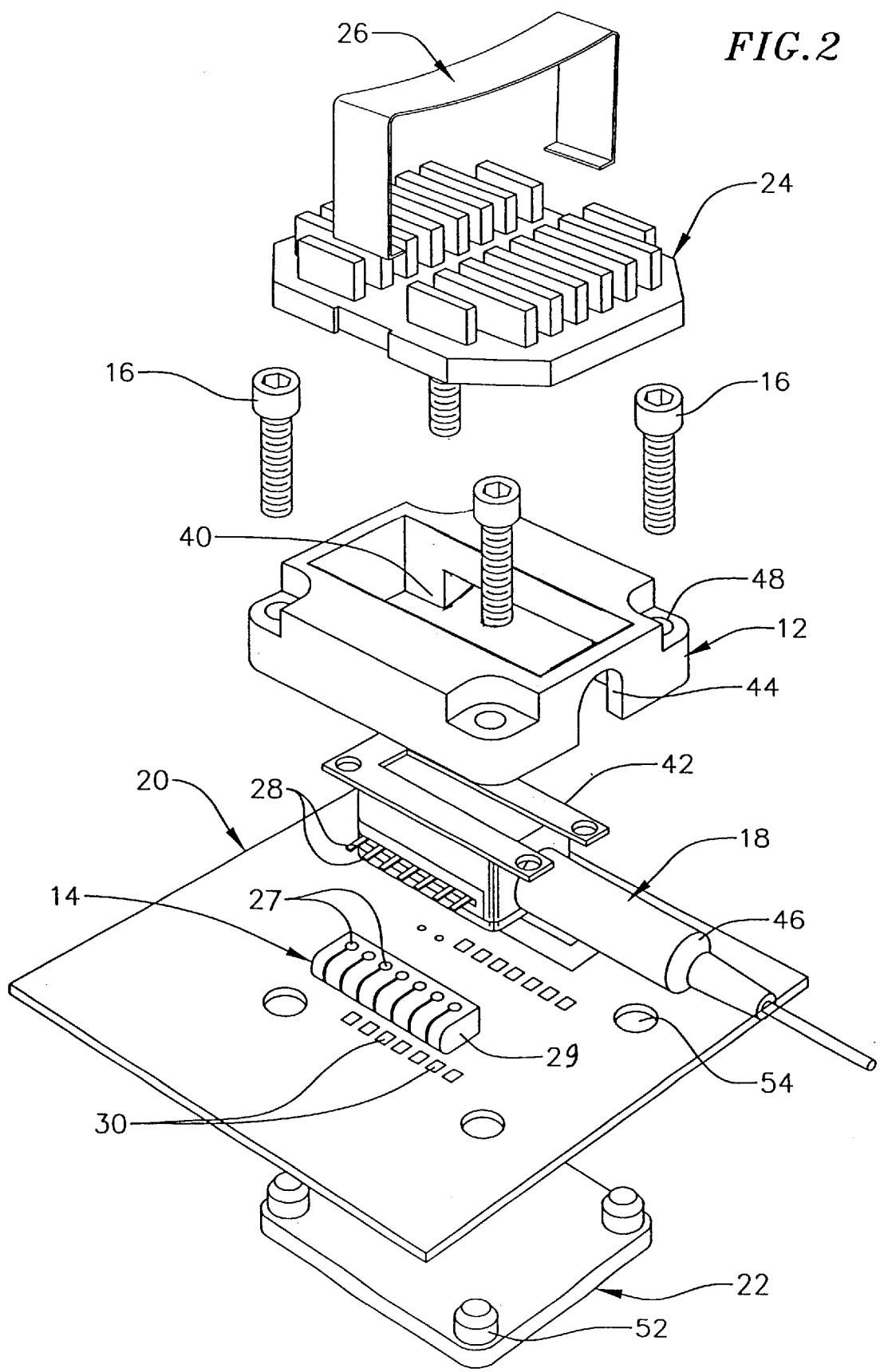
FIG. 2 is an exploded semi-schematic isometric view of the embodiment of FIG. 1.

Referring now to FIGS. 1 and 2, there is shown an embodiment of an in-line lead module package, generally designated 10. The in-line lead module package 10 comprises a receptacle 12, a flex circuit 14, and a plurality of fasteners 16 (the fasteners may be screws, dowel pins, detents, spring clips, and the like). In broad terms, the in-line lead module package 10 is a novel electrical connector for anchoring an electrical module or component to a PCB without soldering. In one embodiment, this is achieved by providing a system of components to encase a laser diode or module 18 to a PCB 20 by anchoring the various components along with the laser diode 18 to the PCB 20 using a plurality of fasteners or screws 16.

Although the laser module 18 is discussed extensively as a laser diode attach, and is commercially available from a number of vendors, a person of ordinary skill in the art will understand that any number of devices, including an IC chip, a receiver, or a transceiver may be used with the in-line module package 10. As such, the laser diode attach is merely illustrative of an application of the present invention. Accordingly, any number of electrical module or component may be used with the exemplary embodiment without deviating from the spirit or scope of the invention. In addition, flexible circuits and PCBs are important elements to the preferred embodiments. But because these devices are well known in the prior art, further discussion of these devices is not believed necessary.

Still referring to FIGS. 1 and 2, the in-line module package 10 further comprises a stiffener plate or a back plate 22. As further discussed below, the back plate 22 serves to align the various electrical components to the PCB 20 and to provide a securing surface for the fasteners 16. Optionally, the in-line lead module package 10 also includes a heatsink 24 in a removable engagement with the receptacle 12 and preferably in a contact arrangement with the surface of the laser diode 18. As is known in the art, the function of the heat sink is to increase the surface area of the laser diode 18 to thereby increase heat transfer. The heat sink 24 is preferably secured to the receptacle 12 and to the module 18 by a spring clip 26. However, as readily understood by persons of ordinary skill in the art, the heat sink 24 may be held to the receptacle 12 by any number of means, including screws, detents, adhesive, etc. It is understood that such variation is contemplated to fall within the spirit and scope of the present invention.

In general terms, the laser module 18 is fixedly secured to the PCB 20 in a solderless fashion by utilizing at least one transitional element. In one embodiment, the receptacle 12 functions as this transitional element. The receptacle 12 provides a transitional function by encasing the laser module 18 and anchoring itself, via screws 16, to the PCB 20 (FIG. 2), instead of soldering the module 18 directly to the PCB 20. Because it is solderless, the in-line lead module package 10 may be removed by a user or a technician without de-soldering the laser module 18. All that is required to remove the heat sink 24 is un-snapping the clip 26, loosening the screws 16, removing the receptacle 12, replacing the laser module 18, and then reversing the steps. Hence, risk of damaging nearby components or the PCB 20 itself when a failed electrical module is replaced via de-soldering is eliminated.

To serve as a conduit for electrical transfer between the laser module 18 and the PCB 20, a flex circuit is used 14. The flex circuit 14 serves as an additional electrical transfer medium (with the PCB 20 being the other electrical transfer medium). Although the PCB 20, shown in FIGS. 1–3, appears relatively small, it is understood by persons of ordinary skill in the art that the PCB 20 is merely illustrative of a larger stuffed PCB with dozens or hundreds of other electrical components soldered or mounted thereto, such as ICs, resistors, capacitors, diodes, etc. Some examples of these large stuffed PCBs may be found in computer servers such as mother boards and any number of computer controlled machines, such as aircraft.

Referring to FIG. 2, in one embodiment, the flex circuit 14 is a single layer gold dot type flex connector with conical shaped contact pads 27. The flex circuit 14 consists of a strip of flexible insulating sheet (commonly made of polyimide material) formed around conductive metal traces with gold dot pads 27 on both ends of the traces. In the embodiment of FIGS. 1 and 2, the flex circuit 14 is folded over an elastomeric strip 29 and is adhered to the elastomeric strip 29 by high temperature resistant adhesive. As understood by persons of ordinary skill in the art (and as further explained below), the elastomeric strip 29 provides elastomeric pressure exertion to other circuitized substrates when pressure is applied to it by the receptacle 12. The elastomeric strip 29 can be any number of elastomeric variety. In an exemplary embodiment, the elastomeric strip 29 is made of substantially solid durometer elastomeric material, such as silicon rubber.

The laser module 18 couples to the PCB 20 and to the other circuitized substrates on the PCB via electrical connection between the device leads 28 (on the laser module 18) and the traces 30 (on the PCB 20). The coupling is carried out in part by compressive force rather than solder or fusion. This compressive force is generated by encasing the receptacle 12 around the laser module 18 and securing the laser module 18 by tightening a plurality of fasteners against the stiffener plate 22. Moreover, although the laser module 18 is described as having a plurality of device leads 28, persons of ordinary skill in the art will understand that there may be instances where the laser module (or other electrical modules if used instead of the laser module) may have only one or more than one device leads. If so, the connection described elsewhere herein to hold the electrical module against the PCB will still apply and minor modifications to the module package, such as to the receptacle and the flex circuit, may have to be made to ensure proper connection.

Figure 3:
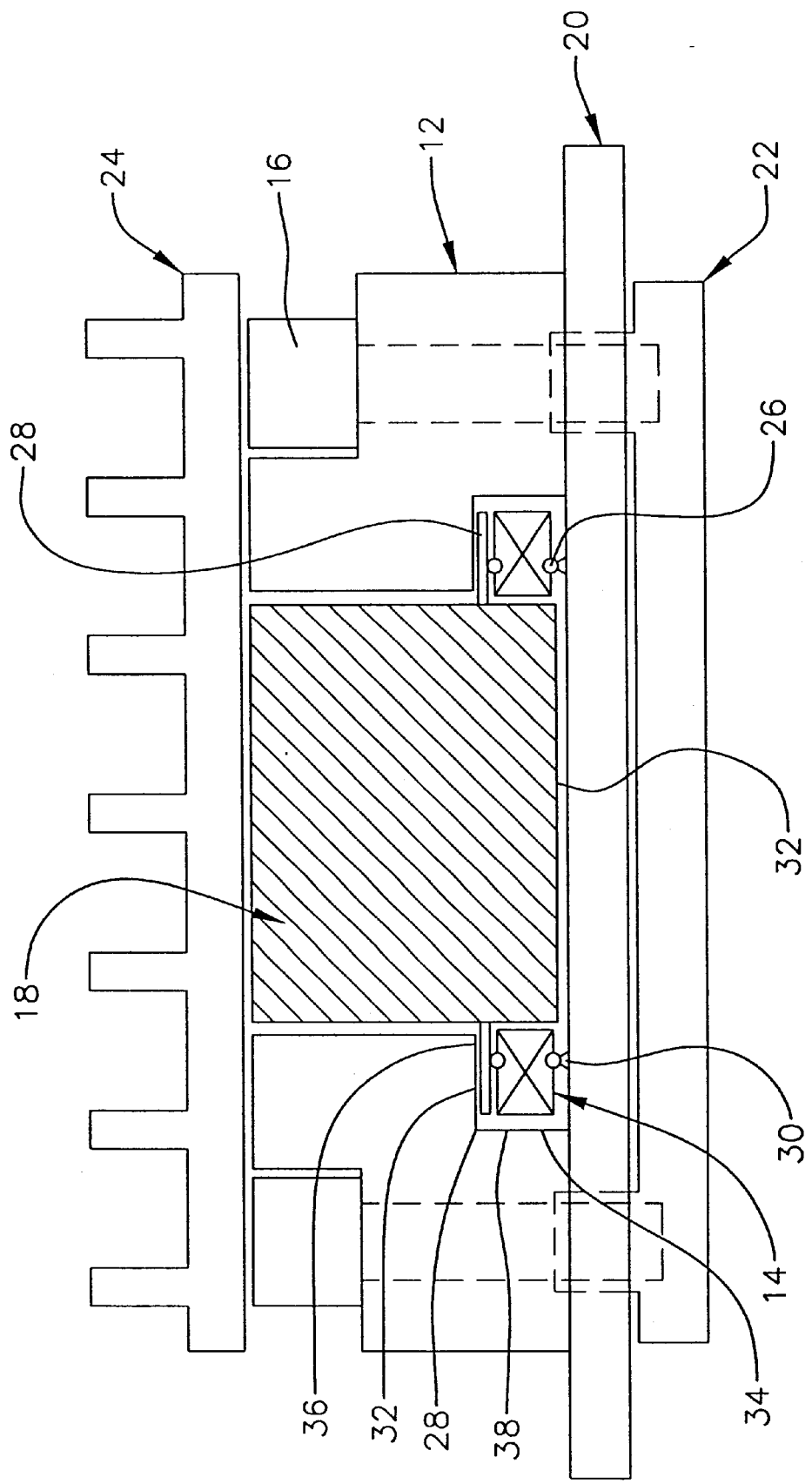
FIG. 3 is a representative cross-sectional view of the embodiment of FIG. 1.

Referring now to FIGS. 2 and 3 for a full disclosure of how pressure is generated by the receptacle 12 on the laser module 18. The laser module 18 has a plurality of device leads 28 emanating from its two sides. The device leads 28 are in electrical communication with various internal circuits (not shown), and are the means by which the laser module 18 communicates with other circuitized substrates on the PCB 20. As seen in FIGS. 2 and 3, these device leads 28 emanate from slightly above the laser module bottom surface 32. Thus, if the laser module 18 is placed on a flat surface, such as a PCB, there exists a small gap between the device leads 28 and the flat surface. In the embodiment of FIGS. 2 and 3, electrical connection is made by bridging this gap with the flex circuit 14. In effect, the flex circuit 14 acts as a conduit between the device leads 28 and the traces 30 by providing a conductive path between the two, via the flex circuit's contact pads 27 and conductive traces. A force is then exerted on the device leads 28, the flex circuit 14, and the PCB 20 to provide the necessary reliable contact pressure.

In the embodiment of FIGS. 2 and 3, the two flex circuits 14 are first placed across the PCB 20 to make contact with corresponding rows of traces 30 on the PCB 20. The laser module 18 is then placed over the two flex circuits 14 with the device leads 28 in contact with the gold dots 27 on the flex circuits 14. The receptacle 12 is then lowered over the laser module 18. Referring to FIG. 3, on the inside of the receptacle 12, there is shown a top wall 32 and a side wall 34. The top wall 32 defines a pressure ledge 36 and the side wall defines a limiting wall 38.

Again referring to FIG. 3, a person of ordinary skill in the art will understand that as the receptacle 12 is lowered over the laser module 18, contact pressure is generated on the flex circuit 14. This contact pressure is generated by the ledge 36 as the ledge is placed over the device leads 28 and tightened down by the screws 16. In an exemplary embodiment, the tension generated by the screws 16 is limited by the limiting wall 38, which is designed to be of sufficient height so that when fully tightened (as indicated in FIG. 3), the limiting wall permits limited compression on the flex circuits 14, but not excessive compression so as to deform the contact pads 27 and 30. Accordingly, in their uncompressed state, the two flex circuits 14 have a height that is approximate to or greater than the limiting wall 38. Thus, when compressed, the flex circuits 14 generate elastomeric pressure as the compressed elastomeric strips 29 try to spring back or uncoil to their natural uncompressed state. In so doing, the elastomeric strips 29 expand out against the two rows of contact pads 27, which in turn push out against the device leads 28 on one side and the traces 30 on the other side. Note that although FIG. 3 does not show actual contact between the various components or flex circuit 14 in a compressed state (for ease of illustration), contact pressure is assumed as discussed above.

Referring again to FIGS. 2 and 3, the receptacle 12 is molded with a generally rectangular passage way 40 (FIG. 2), which is approximately the size of the module housing 42. This passage way 40 allows the module housing 42 to be exposed along its top for heat ventilation. However, the size and shape of the passage way 40 can vary depending on the heat transfer and a number of other factors (such as space and anchoring requirement), and are contemplated to fall within the scope of the present invention. For instance, if heat ventilation is not an issue, the passage way 40 may be configured with a closed top or a semi-closed top, instead of a fully open top as indicated.

Turning particularly to FIG. 2, in a preferred embodiment, the receptacle 12 is fabricated from high temperature resistant plastic, such as polyimide-based resin, although persons of ordinary skill in the art will understand that other non-conductive materials may be used instead of plastic, such as ceramic. The receptacle 12 has several apertures molded therein. One such aperture is a recess 44 on one of the sides, which has a shape approximately that of the laser output nozzle 46. In addition, four through holes 48 are formed along the periphery of the receptacle 12, about the receptacle's four corners.

However, other locations, sizes, and configurations are also possible depending on the contour of the laser module 18 and possibly other requirements, such as space. Hence, the through holes 48 may be molded in other than the four corners.

As discussed above, a preferred mechanism for generating contact pressure is via ledge 32 on the device leads 28. Thus, although the recess 44 is shown to encase the laser output nozzle 46, no significant pressure is created by the contact. However, conceivably, the receptacle 12 may be molded to generate other forces on the laser module 18 if necessary, such as a force around the module outlet nozzle 46 by the recess 44, by configuring the recess to be slightly smaller than the output nozzle.

Figure 4:
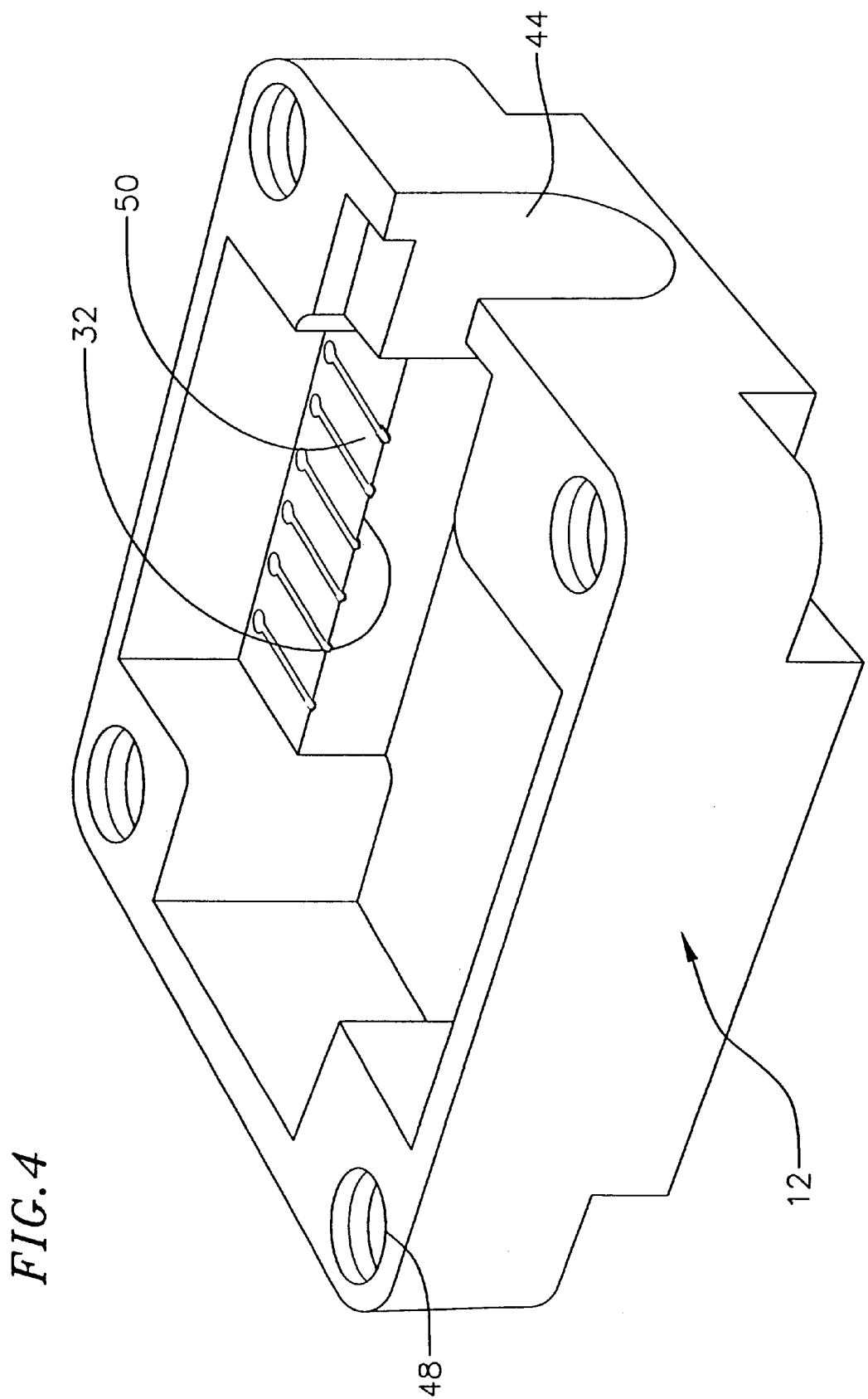
FIG. 4 is an isometric view of a receptacle.

Referring to FIG. 4 in addition to FIG. 3, to assist in aligning the device leads 28 to the contact pads 27, optionally lead alignment ridges 50 may be formed along the ledge 32 to serve this function. The lead alignment ridges 50 are molded along the ledge 32 and are spaced evenly along the width of the ledge 32 and in the same orientation as the device leads 28. Each lead alignment ridge corresponds in shape and dimension as each device lead 28. Thus, when the receptacle 12 is placed over the laser module 18 and the ledge 32 makes contact with the device leads 28, each alignment ridge fits over each device lead in a one to one fashion, similar to a tongue and groove arrangement. However, the device leads 28 are not completely recessed within the ridges. Among other things, this is to ensure that the electrical contact between the device leads 28 and the flex circuit 14 is not interfered with by the lead alignment ridges.

In an exemplary embodiment, the back plate 22 is used to anchor the receptacle 12, rather than anchoring the receptacle 12 directly onto the PCB 20. Referring to FIG. 2, the back plate 22 has approximately the same outer contour as the receptacle 12 and is made of aluminum, although other materials may be used without deviating from the scope of the present invention. In addition, there are four alignment bosses 52 formed around the periphery of the back plate 22 which coincide with the four receptacle through holes 48. The alignment bosses 52 are configured to fit through the corresponding apertures 54 on the PCB 20, and, in a preferred embodiment, are configured with female threads to accept the fasteners 16. However, as discussed elsewhere herein, spring clips, detents and the like may also be used to secure the receptacle 12 to the back plate 22. A registry position is achieved between the flex connector 14, the laser module 18, and the traces 30 when the screws 16 are inserted through and tightened against the alignment bosses 52.

In a preferred embodiment, a heat sink 24 is also used to increase the surface area of the laser module 18 and is preferably made of aluminum or other highly conductive material. However, as understood by persons of ordinary skill in the art, the use of the heat sink 24 is optional and is dependent on the particular application. Although when required (for heat removal), the spring clip 26 or screws may be used to secure the heat sink 24 against the laser module 18.

Figure 5:
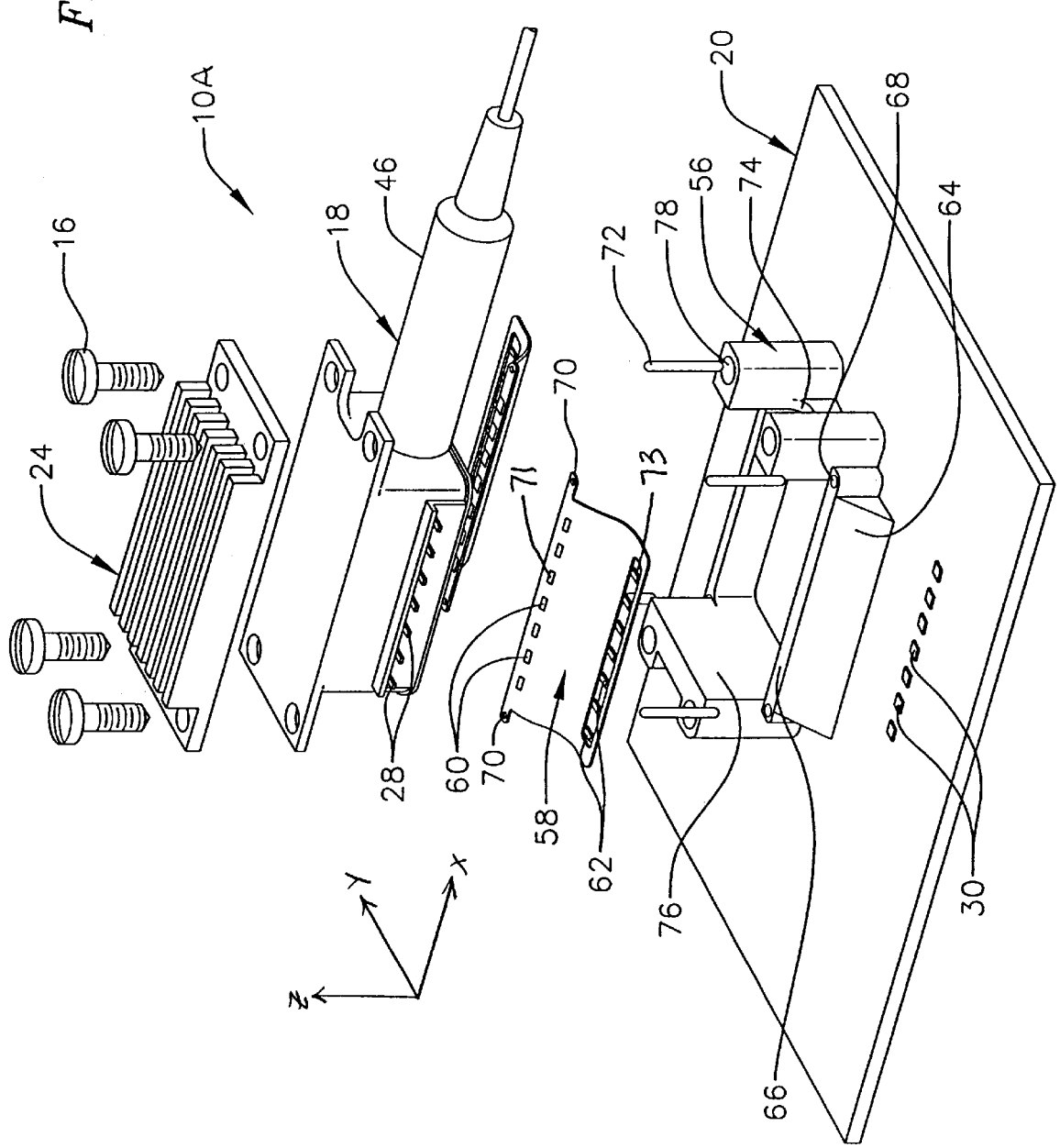
FIG. 5 is an exploded semi-schematic isometric view of an alternative embodiment.

Turning to FIG. 5, there is shown an alternative embodiment 10A of an in-line lead module package of the present invention. In this embodiment, a modified receptacle 56 is used to provide a modified in-line electrical contact arrangement. The modified receptacle 56 has an open arrangement for accommodating an externally mounted flex circuit 58. Broadly speaking, the in-line module package 10A is configured to electrically couple the laser module 18 to the PCB 20 by pressure contact along a first row 71 and by solder along a second row 73. The laser module 18 is then held in place by the heat sink 24 and screws 16. As before, the in-line lead module package 10A allows the laser module 18 to be replaced without soldering and, because of its exposed side feature, allows the contacts between device leads 28 and the flex circuit 58 to be inspected (such as for misalignment, damage, etc.).

In this embodiment, the receptacle 56 is first secured to the PCB 20 via dowel pins 72. The receptacle 56 is configured with a ramp 64, a deck 66, and four registered apertures 68 along its four corners (although the numbers and location of the apertures may vary depending on the space available and possibly other requirements). Instead of utilizing strictly pressure, in the embodiment of FIG. 5, as further discussed below, there are two contact rows 71 and 73, one with pressure and the other with solder.

The first row 71 includes a plurality of contact pads 60 configured and designed to rest against the deck 66. In an exemplary embodiment, the contact pads 60 are gold dot chisel contact pads which are provided due to their large surface contact area. As further discussed below, the large surface area allows more flexibility for aligning the device leads to the flex circuit 58. Among other things, this is because the chisel contact pads have relatively large cross-sectional surface areas as compared to the width of the device leads. The flex circuit 58 is positioned on the deck 66 by placing a pair of flex tabs 70 over the alignment pins 72.

The second row 73 includes an array of solder lugs 62 soldered directly onto the traces 30 of the PCB 20. This makes the second row more or less permanent as de-soldering is not preferred. Accordingly, electrical coupling may be achieved between the laser module 18 and the PCB by way of pressure contact along the first row 71 and solder along the second row 73 of the flex connector 58. Also, it is understood that while the flex circuit 58 is described as having a plurality of solder lugs 62 and chisel contact pads 60, it is possible to provide a flex circuit having a single contact pad and a single solder lug connected by a single trace, should an electronic device with a single lead require such.

Still referring to FIG. 5, the laser module 18 is then lowered onto the receptacle 56, with the laser module outlet 46 resting on the recess 74. In this rested position, the device leads 28 make contact with the contact pads 60 along the first row 71, and along the deck 66. The laser module 18 is prevented from moving laterally in the x direction inside the receptacle 56 by close fitting. This close fitting ensures that the device leads 28 remain in contact with the contact pads 60 by the absence of lateral movement so that they are not displaced from the contact pads 60. In an exemplary embodiment, this is achieved by configuring the distance between the back 76 of the receptacle 56 and the recess 74 to closely fit the outer contour of the laser module 18.

As understood by persons of ordinary skill in the art, in the configuration described, electrical signals flow from the laser module 18, via the device leads 28, to the contact pads 60 of the flex circuit 58 and onto the PCB 20, via welded second row 73. The laser module 18 is then held in place by positioning the heat sink 24 over the top of the laser module 18 and then tightening the screws 16 into four corresponding threaded apertures 78 on the receptacle 56. The amount of torque applied to the screws 16 determines the amount of contact force applied on the device leads 28 and the contact pads 60. Thus, pressure is dependent, in part, on the tensioning of the screws 16.

In the embodiment of FIG. 5, when the laser module 18 malfunctions, instead of de-soldering the solder traces 30 along the second row 73, a technician can simply unscrew the four screws 16 along the top of the heat sink 24 to thereby expose the laser module 18. A new module is then replaced without having to de-solder the traces or the device leads. Unlike the in-line module package 10, the flex circuit 58 in this instant remains with the receptacle 56 and the PCB 20.

Although not shown, in another alternative embodiment, a pair of elastomeric strips approximately the size and shape of the deck 66 may be included. If used for added elastomeric pressure, these elastomeric strips can be mounted between the deck 66 and the flex circuit 58 along the first row 71. In this fashion, the elastomeric strips are configured to generate similar elastomeric pressure when a force is applied as that shown and described in FIGS. 2 and 3 for flex circuit 14.

Figure 6:
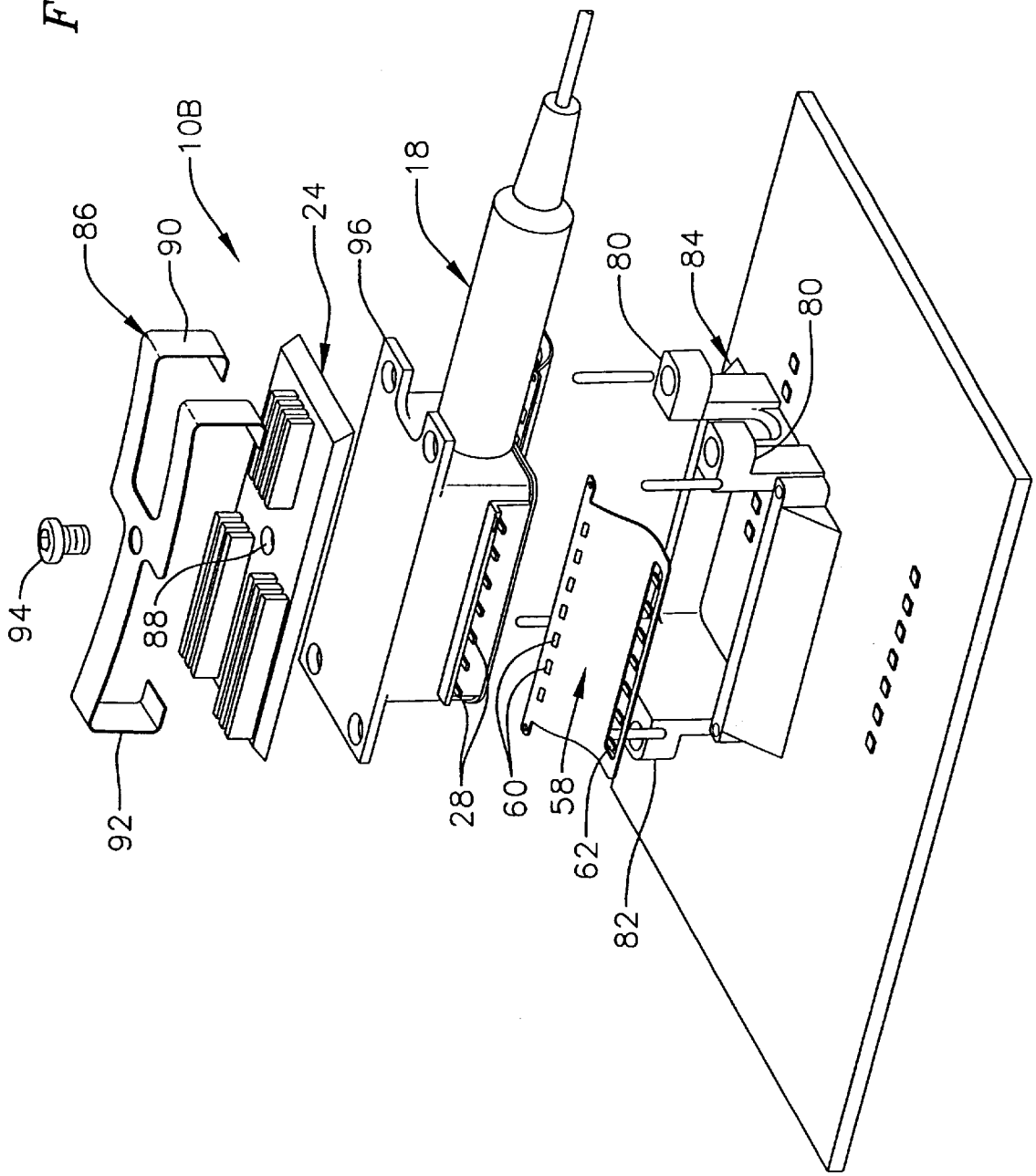
FIG. 6 is an exploded semi-schematic isometric view of yet another alternative embodiment.

Turning to FIG. 6, there is shown an alternative embodiment 10B of an in-line lead module package of the present invention. In this embodiment, the heat sink 24 and the receptacle 84 are slightly modified. Instead of four threaded apertures, the receptacle 84 is configured with a pair of front ears 80 and a single back ear 82. The flex circuit 58 remains the same, in that it includes the same two contact rows as that described for the in-line lead module package 10A. The top of the heat sink 24 has been modified to include a flat surface area, similar to the letter "y". This area corresponds to the shape of a modified spring clip 86. In addition, the heat sink 24 has been fitted with a threaded retaining hole 88.

The spring clip 86 is used to lock the modified heat sink 24 to the in-line lead module package 10B. To engage the spring clip 86, the front spring fingers 90 are wedged underneath the module 84 front ears 80. In a similar fashion, the back spring finger 92 is pulled slightly outward to create an arcuate "y" at the center of the spring clip 86 and is then lowered past the back ear 82. The bending provides sufficient clearance for sliding the clip 86 over the back ear 82. In an exemplary embodiment, a retaining screw 94 is then used to secure the spring clip 86 and to prevent it from accidentally unsnapping from the ears.

In an exemplary embodiment, compressive force between the device leads 28 and the contact pads 60 is determined in part by the length of the extending spring fingers 90, 92. Preferably, the spring fingers 90, 92 are configured to have a slight tensile stress when engaged in the ears 80, 82. This is created in part by configuring the spring fingers 90, 92 to be slightly shorter than the combined thickness of the heat sink 24, the module flange portion 96, and the height of the ears 80, 82.

Figure 7:
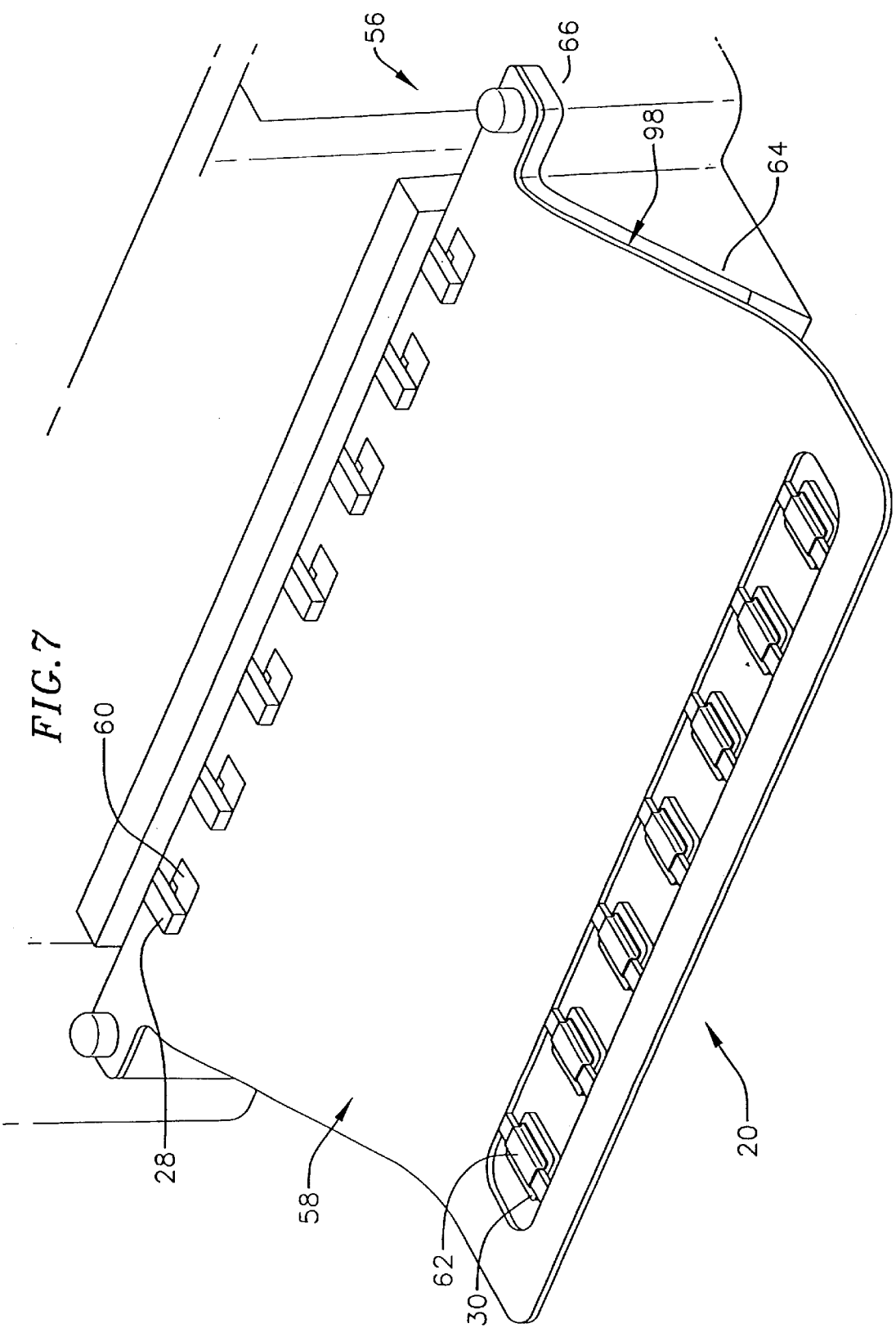
FIG. 7 is a partial semi-schematic isometric view of the embodiment of FIGS. 5 and 6 in an assembled state.

FIG. 7 is a partial isometric view of the in-line lead module package 10A and 10B. As shown, the flex circuit 58 is held on one end by solder (i.e., the lugs 62 and the traces 30 are soldered). On the other end, the flex circuit 58 is secured by pressure. Preferably, the contact pads 60 are gold dot chisel contact pads. These contact pads resemble an elongated pyramid with the top of the pyramid removed. In a preferred embodiment, each contact pad 60 has a top surface area that is wider than the width of the device lead 28.

Optionally, the space or gap between the ramp 64 and the flex circuit 58 can include a high-bond double-sided adhesive tape 98, commonly referred to as VHB™ (Very High Bond) tape. Although not necessary for the operation of the in-line module package 10A and 10B, the tape 98 is preferable as it prevents the flex circuit 58 from lifting when the laser module 18 is removed for repair/replacement. This can happen, for example, when the device leads 28 "stick" to the contact pads 60 due to slight fusion from prolonged periods of usage. In addition, the adhesive tape 98, when include a foam like layer such as an elastomeric material or a compressible material, may act to planarize the various contact points between the device leads and the contact pads (i.e., account for or compensate for the variations in the device leads and/or the contact pads).

Figure 7A:
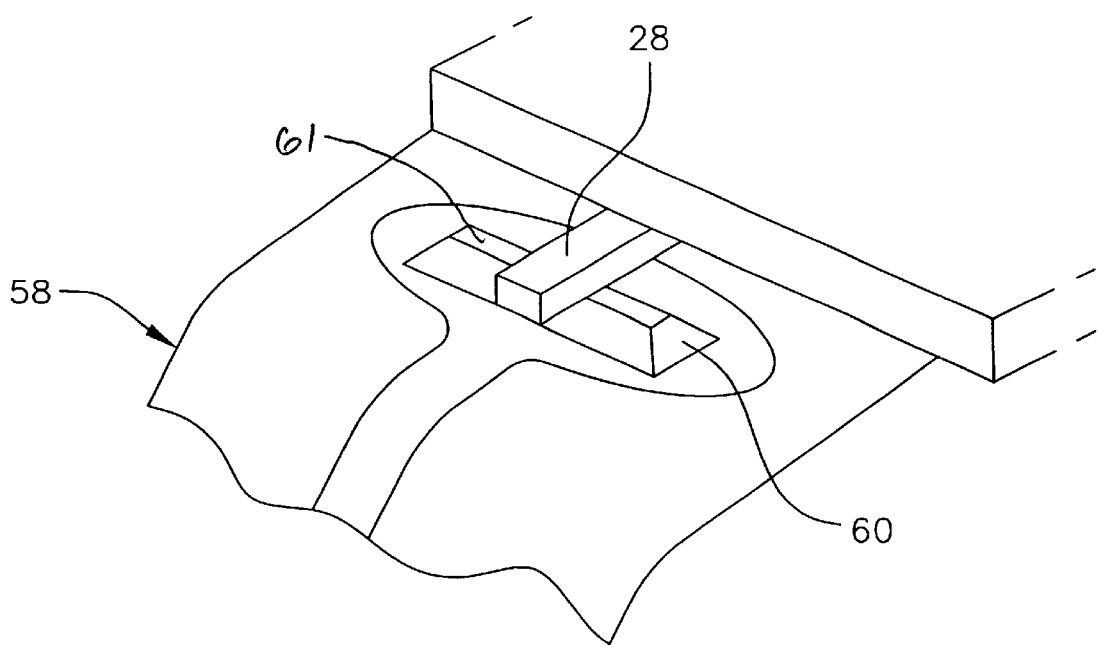
FIG. 7A is an exemplary enlarged view of a portion of a flex circuit of FIG. 7.

FIG. 7A is an exemplary enlarged view of the contact between the device lead 28 and the chisel contact pad 60 of FIG. 7. As shown and described, and as earlier discussed, the gold dot chisel contact pad 60 has a contact surface 61 that is relatively large as compared to the width of the device lead 28. Thus, if vibration or misalignment was to cause the device lead 28 to shift, electrical contact is still preserved due to the large contact surface 61.

Figure 8:
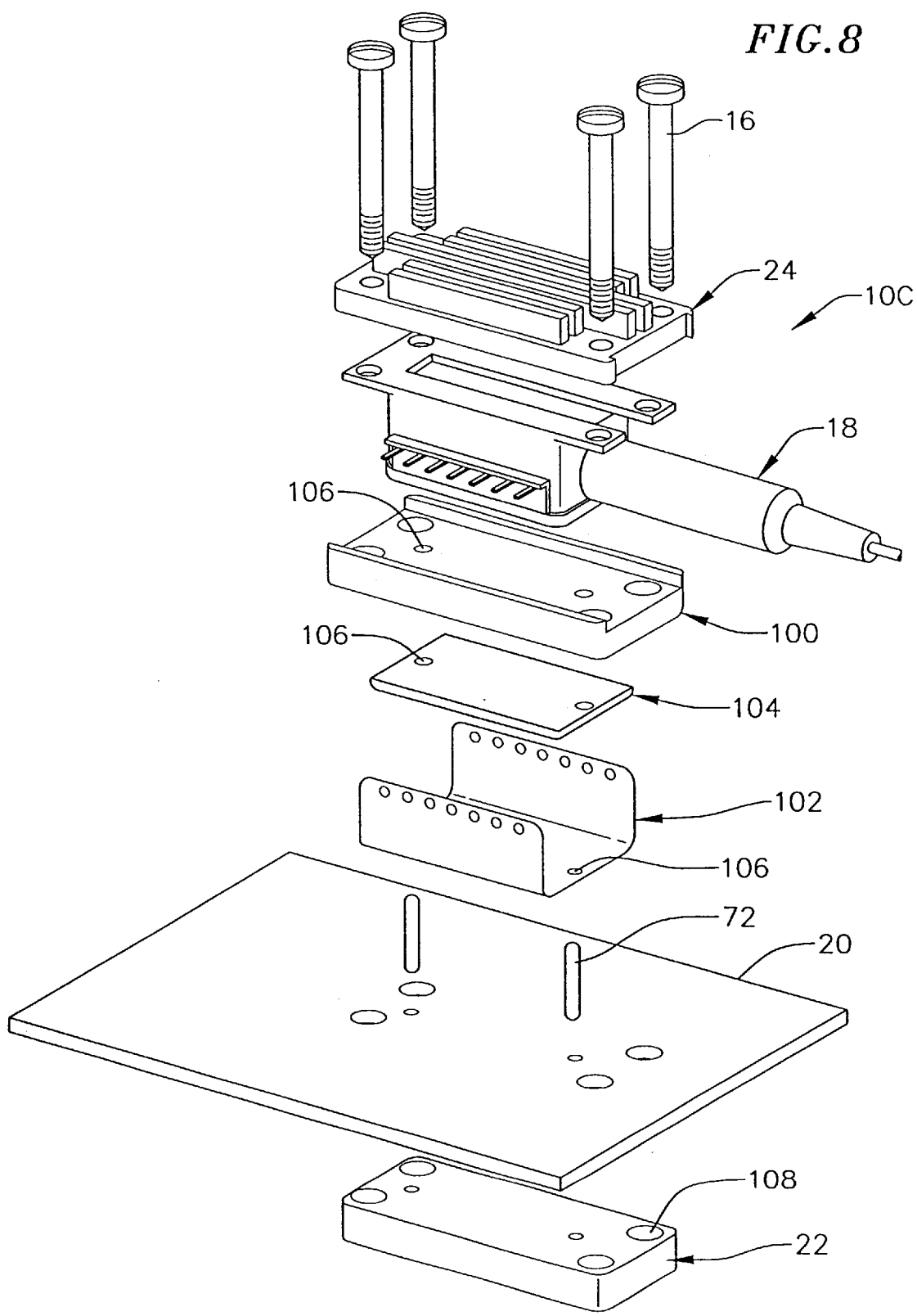
FIG. 8 is an exploded semi-schematic isometric view of another alternative embodiment.
Figure 9:
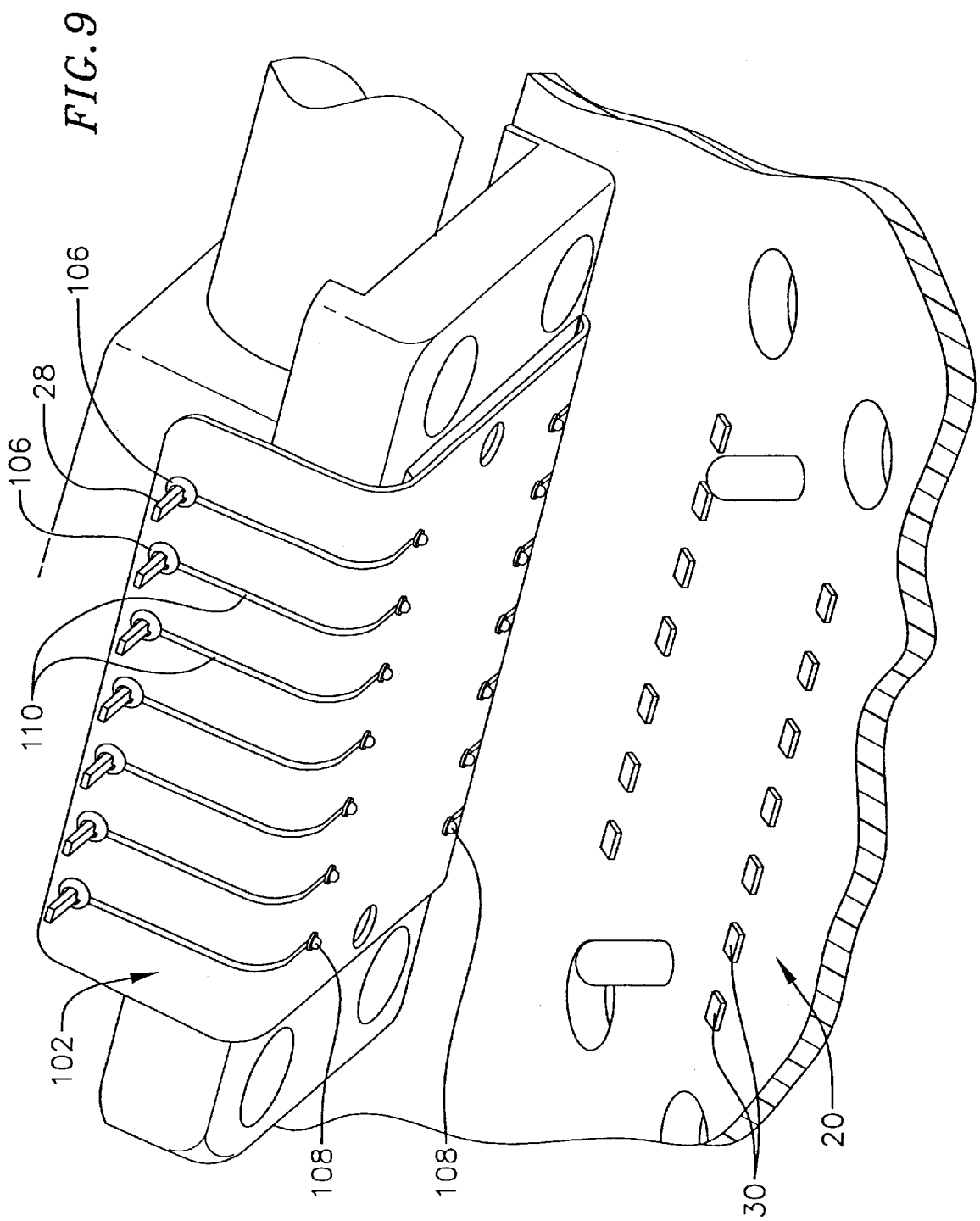
FIG. 9 is a semi-schematic isometric view of the embodiment of FIG. 8 in an assembled position and from a different perspective.

FIG. 8 is another alternative embodiment 10C of an in-line lead module package of the present invention. The modified in-line lead module package 10C includes a stiffener plate 22, dowel pins 72, a modified receptacle 100, a heat sink 24, a flex circuit 102, and an elastomeric pad 104. In an exemplary embodiment, the modified receptacle 100 is positioned below the laser module 18. The elastomeric pad 104 is then placed below the receptacle 100 with the flex circuit 102 to follow. Referring to FIG. 9, the flex circuit 102 has a plurality of contact rings 106, with each ring 106 being configured to wrap around each device lead 28. In an exemplary embodiment, each contact ring 106 is then soldered onto each corresponding device lead 28 to form a permanent soldered connection.

Still referring to FIG. 9, the flex circuit 102 has two rows of contact pads 108 along the horizontal underside. Each contact pad 108 is connected to a contact ring 106 by a conductive trace 110. The flex circuit 102 is configured to electrically couple the laser module 18 to the PCB 20 by transferring electrical signals from the device leads 28, through the contact rings 106, through the conductive traces 110 and then to the contact pads 108, then finally onto corresponding contact pads 30 on the PCB 20.

The in-line lead module package 10C is assembled by first aligning the stiffener plate 22 against the PCB 20 and held in place by dowel pins 72. The assembled package (the laser module 18, the receptacle 100, the elastomer 104, and the flex circuit 102 in a soldered state indicated above) is then lowered onto the PCB 20. This is accomplished by aligning the assembled package via its registered holes 106 to the dowel pins 72. The heat sink 24 is then lowered over the module package and then placed in contact with the laser module 18. The screws 16 are then inserted through corresponding holes in the heat sink 24, the laser module 18, the PCB 20, and the stiffener plate 22, and then threadedly engaged with threaded apertures 108 on the stiffener plate 22. As the screws 16 are tightened, they are in tension and impart a compressive force against the laser module 18.

Thus, like the in-line lead module package 10, 10A, and 10B, when the in-line lead module package 10C of FIG. 8 fails, instead of de-soldering the contact rings 106, a technician can simply unscrew the four screws 16 to thereby loosen and toss away the assembled module package (with the soldered flex circuit 102). A new laser module is then replaced without de-soldering the contact rings 106 from the device leads 28, or from the PCB 20.

Although the preferred embodiment of the invention has been described with some specificity, the description and drawings set forth herein are not intended to be delimiting, and persons of ordinary skill in the art will understand that various modifications may be made to the embodiments discussed herein without departing from the scope of the invention, and all such changes and modifications are intended to be encompassed within the appended claims. Various changes to the module package may be made including using flex circuits with two rows or two sets of contacts but wherein each of the sets has only a single contact protrusion or pad, the receptacle and/or the stiffener plate can be made longer, thicker, having different contours, the electrical module can have a single lead emanating from its sides, etc. Accordingly, many alterations and modifications may be made by those having ordinary skill in the art without deviating from the spirit and scope of the invention, and specifically without deviating from the solderless removal/installation of an electrical module to other circuitized substrates.

What is claimed is:

1. An in-line lead module package removably electrically connecting an electrical module comprising a device lead to an electrical conducting medium comprising a plurality of electrical contacts, said package comprising a flex connector comprising a first contact spaced apart from a second contact in electrical communication with one another by a conductive trace, a receptacle defining a hollow receiving space and comprising an open top and an open bottom, a plate comprising a generally planar portion, and at least one fastener, wherein the hollow receiving space receives a portion of the electrical module and the plate covers at least a portion of the top opening, wherein the flex connector is in electrical communication with the electrical module by pressuring or by soldering the first contact to the device lead, and wherein the flex connector is in electrical communication with the electrical conducting medium by pressuring or by soldering the second contact to one of the plurality of contacts on the electrical conducting medium, and wherein at least one of the electrical communications is made by direct pressure generated by said at least one fastener.

2. The package of claim 1, further including at least one ledge, said at least one ledge exerting said pressure between the flex circuit and the electrical module or between the flex circuit and the electrical conducting medium.

3. The package of claim 1, wherein the plate defines a heat sink, said heat sink removably secured said electrical module by a spring clip.

4. The package of claim 1, wherein the package further including a stiffener plate positioned below the electrical conducting medium, said stiffener plate attached to said at least one fastener and aligned the at least one device lead with the first contact on the flex circuit.

5. The package of claim 1, wherein said at least one fastener comprises a spring clip and wherein the spring clip holds the slate to the receptacle.

6. The package of claim 1, wherein the first contact of the flex connector comprises a chisel contact.

7. The package of claim 1, further including a tape positioned between the flex connector and the receptacle.

8. The package of claim 1, wherein the first contact and the second contact on the flex circuit are both soldered to corresponding contacts.

9. The package of claim 1, wherein the electrical conducting medium is a PCB.

10. The package of claim 1, wherein the flex connector comprises a plurality of chisel contact pads.

11. The package of claim 7, wherein the tape comprises a layer of compressible material.

12. The package of claim 1, wherein the electrical module is at least one of a receiver, a transmitter, a transceiver or an IC chip.

13. An electrical module clamping apparatus removably electrically connecting an electrical module having at least one device lead to a PCB having a plurality of contacts, said apparatus comprising a receptacle having a plurality of apertures spaced apart from one another, a flex circuit having two sets of contacts and at least one contact pad on each of the sets in electrical communication with one another by a corresponding set of electrical traces, and at least two alignment pins; said at least two alignment pins aligning the electrical module and its at least one device lead to said flex circuit and its corresponding first set of contacts or aligning said flex circuit and its second set of contacts to said PCB's plurality of contacts; and said receptacle removably receiving said electrical module and is fastened to said PCB by sassing a plurality of fasteners through the plurality of apertures located on the receptacle.

14. The apparatus of claim 13, further including a heat sink and at least two fasteners, wherein said at least two fasteners are removably secured said heat sink to said electrical module and said PCB.

15. The apparatus of claim 13, wherein each of the two sets of contacts on said flex circuit is in at least one of a compressed configuration with said module's at least one device lead or in a soldered arrangement with a corresponding number of contacts on said PCB.

16. The apparatus of claim 13, wherein each of said two sets of contacts on said flex circuit is in a compressed arrangement.

17. The apparatus of claim 13, further including a heat sink, said heat sink removably secured to said electrical module by a spring clip.

18. The apparatus of claim 15, further including high temperature resistant tape to tape said flex circuit to said receptacle.

19. The apparatus of claim 13, wherein one of the two sets of contacts on the flex circuit comprises at least one chisel contact pad.

20. The apparatus of claim 13, further comprises a two-sided adhesive tape positioned between the flex circuit and the receptacle, and wherein the adhesive tape comprises a compressible material.

21. The apparatus of claim 13, wherein the electrical module is at least one of a receiver, a transmitter, a transceiver, or an IC chip.

22. An electrical connecting apparatus, said apparatus comprising a receptacle comprising body, a receiving portion, and at least two through holes along a periphery of the body, a flex circuit having a first set of contacts and a second set of contacts in electrical communication with one another by a set of conductive trace, wherein the first set of contacts or the second set of contacts comprises at least one chisel contact pad comprising a contact surface having a width, a PCB comprising a plurality of contact points, and an electrical module having at least one device lead having a width, wherein at least a portion of said electrical module is received in said receiving portion of the receptacle and said receptacle is removably secured to said PCB by passing a plurality of fasteners through said at least two through holes, and said flex circuit is electrically coupled to said electrical module along the flex circuit's first set of contacts and to said PCB along the flex circuit's second set of contacts, and wherein the width on the device lead is less than the width on the chisel contact pad.

23. The apparatus of claim 22, wherein the width of the device lead is positioned within the width of said chisel contact pad.

24. The apparatus of claim 22, wherein the electrical module is at least one of a receiver, a transmitter, or a transceiver.

25. The apparatus of claim 22, further comprising adhesive tape positioned between the flex circuit and the receptacle, and wherein said adhesive tape comprises compressible material.

26. The apparatus of claim 22, wherein the first set of electrical contacts is under pressure or is soldered with a corresponding number of device leads on the electrical module, and the second set of electrical contacts is under pressure or is soldered with a corresponding number of contact points on the PCB, and wherein pressure is applied to at least one interface between the electric module and the flex circuit or between the flex circuit and the PCB.

27. A connection apparatus comprising:
an electrical module comprising a contact lead;
a receptacle comprising a receiving space subjacent to the electrical module such that the electrical module is positioned over the receptacle and in the receiving space of the receptacle;
a flex circuit comprising a first contact pad spaced apart from a second contact pad and in communication with one another by a contact trace;
a PCB comprising a plurality of electrical contacts;
clamping means;
a stiffener plate comprising a plurality of openings; and
wherein the first contact of the flex circuit is in electrical communication with the contact lead of the electrical module and the second contact lead of the flex circuit is in electrical communication with one of the electrical contacts of the PCB and the PCB is in electrical communication with the electrical module by way of the contact trace; and
wherein the clamping means clamps the electrical module and the receptacle to the PCB by engaging the stiffener plate positioned below the PCB.

28. The connection apparatus of claim 27, wherein the clamping means comprises a heat sink, having a plurality of through holes, and a plurality of fasteners, and wherein the plurality of fasteners pass through the plurality of through holes of the heat sink to engage the stiffener plate.

29. The connection apparatus of claim 27, wherein the first contact of the flex circuit and the contact lead of the electrical module are soldered together.

30. The connection apparatus of claim 27, wherein the clamp means exerts pressure against the contact between the second contact lead of the flex circuit and one of the electrical contacts of the PCB.

31. The connection apparatus of claim 27, wherein the clamping means comprises a heat sink having a plurality of fins.

32. The connection apparatus of claim 27, wherein the clamping means comprises a heat sink and a spring clip, and wherein the spring clip is mounted over the heat sink and clips against a ledge on the receptacle.

33. The connection apparatus of claim 27, wherein the first contact of the flex circuit comprises a chisel contact.

34. The connection apparatus of claim 27, wherein the clamping means exerts pressure against the contact between the first contact of the flex circuit and the contact lead of the electrical module and wherein the contact between the second contact of the flex circuit and one of the electrical contacts of the PCB is soldered.

\* \* \* \* \*